(12) United States Patent
Liu et al.

(10) Patent No.: US 11,180,697 B2
(45) Date of Patent: Nov. 23, 2021

(54) ETCHING SOLUTION HAVING SILICON OXIDE CORROSION INHIBITOR AND METHOD OF USING THE SAME

(71) Applicant: Versum Materials US, LLC, Tempe, AZ (US)

(72) Inventors: Wen Dar Liu, Chupei (TW); Yi-Chia Lee, Chupei (TW); Chung-Yi Chang, New Taipei (TW)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/681,246

(22) Filed: Nov. 12, 2019

(65) Prior Publication Data
US 2020/0157422 A1 May 21, 2020

Related U.S. Application Data

(60) Provisional application No. 62/769,195, filed on Nov. 19, 2018.

(51) Int. Cl.
*C09K 13/00* (2006.01)
*H01L 21/3213* (2006.01)
*H01L 29/66* (2006.01)

(52) U.S. Cl.
CPC ........ *C09K 13/00* (2013.01); *H01L 21/32134* (2013.01); *H01L 29/66545* (2013.01)

(58) Field of Classification Search
CPC .......................... C09K 13/00; H01L 21/30604
See application file for complete search history.

(56) References Cited

U.S. PATENT DOCUMENTS

| | | | |
|---|---|---|---|
| 2002/0077259 A1* | 6/2002 | Skee | C11D 11/0047 510/175 |
| 2006/0207964 A1* | 9/2006 | Chen | H01L 21/32134 216/2 |
| 2007/0010411 A1 | 1/2007 | Amemiya et al. | |
| 2008/0076688 A1* | 3/2008 | Barnes | C11D 3/34 510/175 |
| 2011/0034362 A1* | 2/2011 | Egbe | C11D 7/3209 510/176 |
| 2011/0281436 A1 | 11/2011 | Inaba et al. | |
| 2012/0040529 A1 | 2/2012 | Klipp | |

(Continued)

FOREIGN PATENT DOCUMENTS

| | | |
|---|---|---|
| JP | 2002100603 | 4/2002 |
| JP | 2002202618 | 7/2002 |

(Continued)

*Primary Examiner* — Thomas T Pham
(74) *Attorney, Agent, or Firm* — William T. Slaven, IV

(57) ABSTRACT

Described herein is an etching solution suitable for the selective removal of polysilicon over silicon oxide from a microelectronic device, which comprises: water; at least one of a quaternary ammonium hydroxide compound; optionally at least one alkanolamine compound; a water-miscible solvent; at least one nitrogen containing compound selected from the group consisting of a $C_{4-12}$ alkylamine, a polyalkylenimine, a polyamine, a nitrogen-containing heterocyclic compound, a nitrogen-containing aromatic compound, or a nitrogen-containing heterocyclic and aromatic compound; and optionally, a surfactant.

8 Claims, 2 Drawing Sheets

(56) References Cited

U.S. PATENT DOCUMENTS

| | | | |
|---|---|---|---|
| 2013/0296214 A1* | 11/2013 | Barnes | H01L 21/02063 |
| | | | 510/176 |
| 2015/0152366 A1 | 6/2015 | Shimada et al. | |
| 2016/0186058 A1* | 6/2016 | Parris | C09K 13/02 |
| | | | 216/18 |
| 2017/0084719 A1 | 3/2017 | Kim et al. | |
| 2017/0145311 A1* | 5/2017 | Liu | H01L 21/30608 |
| 2019/0085240 A1 | 3/2019 | Liu et al. | |

FOREIGN PATENT DOCUMENTS

| KR | 20140051141 A | 4/2014 |
|---|---|---|
| KR | 20180047816 | 5/2018 |
| KR | 20180047816 A | 5/2018 |

* cited by examiner

ETCHING SOLUTION HAVING SILICON OXIDE CORROSION INHIBITOR AND METHOD OF USING THE SAME

This application claims priority to U.S. Ser. No. 62/769,195, titled "Silicon Oxide Corrosion Inhibitor" filed Nov. 19, 2018.

BACKGROUND OF THE INVENTION

The present invention relates to aqueous etching solutions used in the manufacture of semiconductor devices. More specifically, the present invention relates to an etching solution used for selectively etching a dummy gate made of silicon in a process for producing a transistor using a structural body including a dummy gate laminate formed by laminating at least a high dielectric material film and the dummy gate made of silicon in which the dummy gate is replaced with a metal gate containing hafnium, zirconium, titanium, tantalum or tungsten, and a process for producing a transistor using the etching solution.

Semiconductors have been continuously improved in performance, costs and power consumption by reduction of a gate length and a gate thickness of transistors, i.e., so-called micronization thereof. To continue to achieve the micronization of transistors to meet future requirements, the gate thickness of transistors using a conventional gate insulating film made of silicon oxide becomes excessively small, so that a leakage current owing to a tunnel current increases, and power consumption becomes large. Moreover, in recent years, there is an increasing demand for mobile equipment using semiconductor devices such as mobile phones, notebook type personal computers and potable music players. In this case, a power supply for such mobile equipment has been frequently relied upon rechargeable batteries. Therefore, it has been required that the semiconductor devices used in the mobile equipment have a low power consumption to achieve long-term use thereof. As a result, for the purpose of reducing a leakage current during a stand-by state of the equipment, a technique has been proposed to combine an insulating material and a gate electrode as constituents of a transistor, wherein a high dielectric material and a metal gate are used in place of the conventional combination of silicone oxide and polysilicon.

One method of producing the high dielectric material and the metal gate is referred to as a gate-last method in which after producing a transistor using combination of a high dielectric material and polysilicon, the polysilicon is removed to replace it with a metal gate. In FIG. 1, there is shown a schematic sectional view of a part of a transistor to illustrate the dummy gate removal process. Shown in FIG. 1 is an oxide layer 11 with a polysilicon deposited thereon between insulating material 15. The insulating material 15, polysilicon 12 and oxide layer 11 are on a silicon layer or substrate 10. When the dummy polysilicon gate 12 is removed (as shown in FIG. 1 partially removed and then fully removed) to form an opening 13 by an alkaline wet chemical process, the gate oxide 11 will be exposed to the alkaline formulation. Because the gate oxide layer 11 is thin (typically around 10-30 Å), there is a strong potential that the wet chemistry can penetrate through the gate oxide if the gate oxide is not well protected. For this reason, if an etching amount of the polysilicon 12 per unit time (hereinafter referred to as an "etch rate") is small, the time required for the etching tends to be prolonged and risk for corrosion of the oxide layer is increased. Conventional polysilicon wet etching chemistry typically employs etchants like $NH_4OH$ or TMAH that exhibit decent polysilicon removal power, however, the etch rate on gate oxides such as, for example, silicon oxide, is a concern when the device design gets smaller. Minimizing oxide loss in a dummy gate removal process becomes critical for success for advanced technology nodes.

Accordingly, there is a need in the art for a wet chemistry formulation that has a very high etch rate for polysilicon and that significantly prevents the etching of the oxide layer or any other metal, side wall, and interlayer insulating films that may also be exposed to such wet chemistry.

BRIEF SUMMARY OF THE INVENTION

This need is met by the present disclosure in that the inventors have discovered certain surfactants and nitrogen-containing compounds can significantly suppress oxide etch rate in an alkaline wet chemical etching formulation without significantly suppressing the etch rate of the polysilicon.

In one aspect, there is provided an etching solution suitable for the selective removal of polysilicon over silicon oxide from a microelectronic device, which comprises or consists essentially of or consists of: water; at least one of a quaternary ammonium hydroxide compound; optionally at least one alkanolamine compound; a water-miscible solvent; at least one nitrogen containing compound selected from the group consisting of (or selected from) a $C_{4-12}$ alkylamine, a polyalkylenimine, a polyamine, a nitrogen-containing heterocyclic compound, a nitrogen-containing aromatic compound, a nitrogen-containing heterocyclic and aromatic compound, or other nitrogen-containing compound; and optionally, a surfactant In another aspect, provided herein is a method for selectively enhancing the etch rate of polysilicon relative to silicon oxide in a composite semiconductor device comprising polysilicon and silicon oxide, the method comprising the steps of: contacting the composite semiconductor device comprising polysilicon and silicon oxide with an aqueous composition comprising or consisting essentially of or consisting of: at least one of a quaternary ammonium hydroxide compound; optionally at least one alkanolamine compound; a water-miscible solvent; at least one nitrogen containing compound selected from the group consisting of (or selected from) a $C_{4-12}$ alkylamine, a polyalkylenimine, a polyamine, a nitrogen-containing heterocyclic compound, a nitrogen-containing aromatic compound or a nitrogen-containing heterocyclic and aromatic compound; and optionally, a surfactant; and rinsing the composite semiconductor device after the polysilicon is at least partially removed, wherein the selectivity of the etch for silicon over silicon oxide is greater than 1,000.

The embodiments of the invention can be used alone or in combinations with each other.

DETAILED DESCRIPTION OF THE INVENTION

Figure 1:
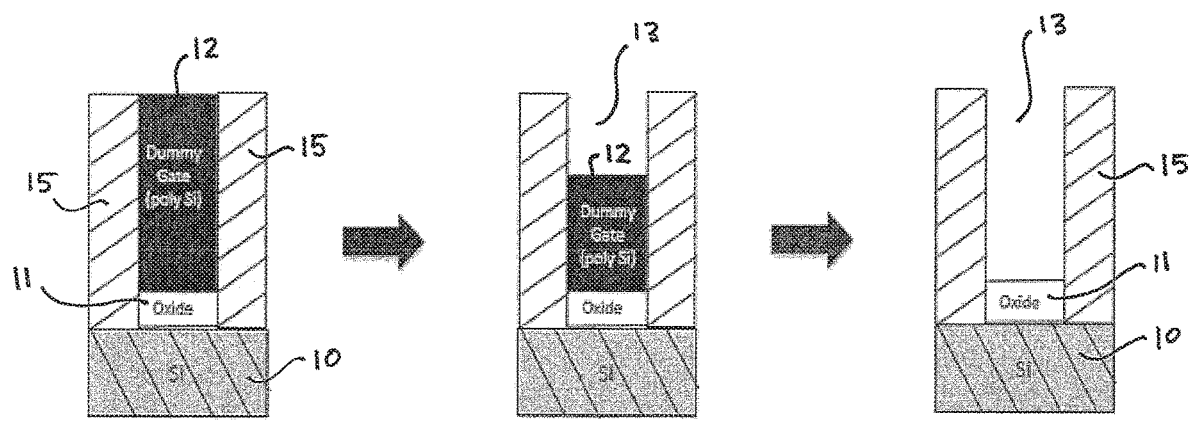
FIG. 1 is an illustration of a dummy gate removal process by alkaline polysilicon etchant.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context and could be replaced with "one or more" or "at least one". The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the more narrow language of "consisting essentially of" and "consisting of."

Embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of polysilicon over silicon oxide from a microelectronic device having such material(s) thereon during its manufacture.

It will be understood that the term "polysilicon" as deposited as a material on a microelectronic device will include silicon.

For ease of reference, "microelectronic device" or "semiconductor device" corresponds to semiconductor substrates, for example wafers, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" or "semiconductor device" is not meant to be limiting in any way and includes any substrate that will eventually become a microelectronic device or microelectronic assembly.

A "composite semiconductor device" or "composite microelectronic device" means that the device has more than one materials and/or layers and/or portions of layers present on a non-conductive substrate. The materials may comprise high K dielectrics, and/or low K dielectrics and/or barrier materials and/or capping materials and/or metal layers and/or others known to persons of skill.

As defined herein, "low-k dielectric material" corresponds to any material used as a dielectric material in a layered or composite microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "high-k dielectric material" (or high dielectric material) corresponds to any material used as a dielectric material in a layered or composite microelectronic device, wherein the material has a dielectric constant above the dielectric constant of SiO2. High-k dielectric materials may include aluminum oxide, hafnium dioxide, zirconium dioxide, hafnium silicate, zirconium silicate, typically deposited using atomic layer deposition.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.001 wt. %. "Substantially free" also includes 0.000 wt. %. The term "free of" means 0.000 wt. % or less.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Note all percentages of the components are weight percentages and are based on the total weight of the composition, that is, 100%.

In the broad practice of this aspect, the etching solution of the present development comprises, consists essentially of, or consists of: water; at least one of a quaternary ammonium hydroxide compound; optionally at least one alkanolamine compound; a water-miscible solvent; at least one nitrogen containing compound selected from the group consisting of (or selected from) a $C_{4-12}$ alkylamine, a polyalkylenimine, a polyamine, a nitrogen-containing heterocyclic compound, a nitrogen-containing aromatic compound, a nitrogen-containing heterocyclic and aromatic compound, and optionally, a surfactant.

In some embodiments, the etching solution compositions disclosed herein are formulated to be substantially free of or free of at least one of the following chemical compounds: peroxides, ammonium hydroxide, metal hydroxides, and any source of fluoride ions.

The compositions of the present invention are suitable for use in a process for making a gate all around structure on an electronic device. Such processes are known in the art such as, for example, the process disclosed in US 2017/0179248, US 2017/0104062, US 2017/0133462, and US 2017/0040321, the disclosures of which are incorporated herein by reference.

The headings employed herein are not intended to be limiting; rather, they are included for organizational purposes only.

The compositions disclosed herein exhibit excellent polysilicon removal preferentially over silicon oxide.

The etching solution disclosed herein is suitable for use in the removal of a dummy gate made of polysilicon in a process for producing, for example, a transistor using a structural body which includes a substrate, and a dummy gate laminate formed by laminating at least a high dielectric material film and the dummy gate made of polysilicon, a side wall disposed to cover a side surface of the laminate and an interlayer insulating film disposed to cover the side wall which are provided on the substrate, in which the dummy gate is replaced with a metal gate containing hafnium, zirconium, titanium, tantalum or tungsten.

Water

The etching compositions of the present development are aqueous-based and, thus, comprise water. In the present invention, water functions in various ways such as, for example, to dissolve one or more components of the composition, as a carrier of the components, as an aid in the removal of residue, as a viscosity modifier of the composition, and as a diluent. Preferably, the water employed in the cleaning composition is de-ionized (DI) water. The ranges of water described in the next paragraph include all of the water in the composition from any source.

It is believed that, for most applications, the weight percent of water in the composition will be present in a range with start and end points selected from the following group of numbers: 0.5, 1, 5, 10, 12, 15, 17, 20, 23, 25, 30, 35, 40, 45, 50, 55, 60, 65, 70, 80, 85, and 90. Examples of the ranges of water that may be used in the composition include, for examples, from about 0.5% to about 60% by wt., or 1% to about 60% by wt. of water; or from about 0.5% to about 40% by wt., or from about 1% to about 25% by wt., or from about 1% to about 20% by wt., or from about 1% to about 15% by wt.; or from about 5% to about 20% by wt.; or from 5% to about 15% by wt. or from 20% to about 60% by wt., or from 25% to about 60% by wt. or from about 30% to about 60% by wt., or from about 23% to about 35% by wt.; or from about 20% to about 40% by wt.; or from about 35% to about 55% by wt.; or from about 15% to about 30% by wt.; or from about 5% to about 35% by wt.; or from about 10% to about 20% by wt. of water. Still other preferred embodiments of the present invention may include water in an amount to achieve the desired weight percent of the other ingredients.

Polysilicon Etchant

The etching compositions of the present invention comprise a silicon etchant that is at least one of a quaternary ammonium hydroxide. The quaternary ammonium hydroxide also imparts an alkalinity to the etching solutions. In embodiments, the pH of the resulting etching solution is from about 7.5 to 14, from about 9.0 to 14, and from about 11 to 14 or any pH in a pH range defined by endpoints selected from the following list: 7.5, 8, 8.5, 9, 9.5, 10, 10.5, 11, 11.5, 12, 13, 13.5 and 14.

The quaternary ammonium hydroxide may be a quaternary ammonium hydroxide in which all of the alkyl groups are the same, that is, a tetraalkylammonium hydroxide, such as, tetramethylammonium hydroxide, tetraethylammonium hydroxide, and/or tetrabutylammonium hydroxide and so on.

Alternatively and preferred are quaternary ammonium hydroxides including tetraalkylammonium hydroxides wherein not all of the alkyl groups are the same. Examples of tetraalkylammonium hydroxides wherein not all of the alkyl groups are the same include the group consisting of benzyltrimethyl ammonium hydroxide, ethyltrimethyl ammonium hydroxide (ETMAH), 2-hydroxyethyltrimethyl ammonium hydroxide, benzyltriethyl ammonium hydroxide, hexadecyltrimethyl ammonium hydroxide, methyltriethylammonium hydroxide and mixtures thereof.

It is believed that the amount of the quaternary ammonium hydroxide compound in the composition will, for the most applications, comprise weight percents within a range having start and end points selected from the following group of numbers: 0.5, 1, 2, 3, 4, 5, 6, 7, 8, 10, 12, 15, 20, 25, 30 and 35. Examples of ranges of quaternary ammonium hydroxide in the compositions of this invention may be from about 1% to about 35%, or from about 1% to about 20%, or from about 1% to about 10% by weight of the composition, specifically, about 8% to about 35% by weight of the composition, or more specifically, about 20% to about 35% by weight of the composition. By way of example, if the quaternary ammonium hydroxide compound is an ETMAH (20% solution), then if added at 25% by weight, there will be 5% (active) quaternary ammonium hydroxide compound. Actives stated differently is on a "neat" basis, both meaning that the solvent (may be water) that a component for example quaternary ammonium hydroxide is added to the composition in is not included in the amount of the component, but is added to the water or solvent amount in the composition. So, if the quaternary ammonium hydroxide compound is an ETMAH (20% aqueous solution), then if 25 grams are added to a composition, then there will be 5 grams ETMAH and 20 grams water added to the composition. In some embodiments, the quaternary ammonium hydroxide compound (on a neat basis) may comprise weight percents within a range having start and end points selected from the following group of numbers: 0.1, 0.2, 0.3, 0.4, 0.5, 0.6, 0.8, 1, 1.2, 1.4, 1.6, 2, 2.4, 3, 4, 5, 6, 7, 8, 9, 10, 11, 12, 14, 15, 17, 20, 25, 30 and 35. Examples of ranges of quaternary ammonium hydroxide (neat) in the compositions of this invention may be from about 2% to about 15% weight percent and, more specifically, from about 3 to about 12%, or from about from 3 to about 7%, from about 1 to about 10%, or from about 1 to about 12%, or from about 0.1 to about 10% or from about 1 to about 8%, or from about 0.5 to about 5%, or from about 1 to about 7%, or from about 0.5 to about 7% by weight of the composition.

Regarding the quaternary ammonium hydroxide, the etching compositions disclosed herein may be substantially free of or free of ammonium hydroxide and tetramethylammonium hydroxide (TMAH), and may be substantially free of or free of all tetraalkyl ammonium hydroxides wherein the alkyl groups are all the same.

Alkanolamine (Optional)

The etching compositions of the present invention optionally comprise a silicon etchant that comprises at least one alkanolamine.

Suitable alkanolamine compounds include the lower alkanolamines which are primary, secondary and tertiary having from 1 to 5 carbon atoms. Examples of such alkanolamines include N-methylethanolamine (NMEA), monoethanolamine (MEA), diethanolamine, mono-, di- and tri-isopropanolamine, 2-(2-aminoethylamino)ethanol, 2-(2- aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

In preferred embodiments, the alkanolamine may be selected from (or may be selected from the group consisting of) triethanolamine (TEA), diethanolamine, N-methyl diethanolamine, diisopropanolamine, monoethanol amine, amino(ethoxy) ethanol (AEE), N-methyl ethanol amine, monoisopropanol amine, cyclohexylaminediethanol, and mixtures thereof.

It is believed that the amount of the alkanolamine compound in the composition will, for the most applications, comprise weight percents within a range having start and end points selected from the following group of numbers: 0.5, 1, 2, 3, 5, 7, 8, 10, 12, 15, 20, 25, 30, 35, 40, 45, 50, 55, 60, 65 and 70. Examples of ranges of alkanolamine compound in the compositions of this invention may be from about 1% to about 50% by weight of the composition, specifically, about 8% to about 50% by weight of the composition, or more specifically, about 20% to about 50% by weight of the composition. In some embodiments, the amine compound comprises from about 20% to about 65% weight percent and, more specifically, from about 10 to about 60%, or from about 15 to about 55% or from about 20 to about 50% or from about 1 to about 12% or from about 25 to about 45% or from about 30 to about 40% by weight of the composition.

The alkanolamine compound, if employed in excess may also serve as the base component of a buffer if a corresponding conjugate acid is employed such as, for example, a polyfunctional organic acid. Alternatively, the compositions of this invention may be substantially free of or free of added polyfunctional acids and/or inorganic acids and/or organic acids. Additionally, in alternative embodiments, the compositions of this invention may be substantially free or free of any of the above-listed individual alkanolamines alone or in any combination.

Water-Miscible Organic Solvent

The etching compositions of the present invention comprise a water-miscible organic solvent. Examples of water-miscible organic solvents that can be employed are ethylene glycol, propylene glycol, 1,4-butanediol, tripropylene glycol methyl ether, propylene glycol propyl ether, diethylene gycol n-butyl ether (BDG) (e.g., commercially available under the trade designation Dowanol® DB), dipropylene glycol methyl ether (DPM) hexyloxypropylamine, poly (oxyethylene)diamine, dimethylsulfoxide (DMSO), tetrahydrofurfuryl alcohol, glycerol, alcohols, sulfolane, sulfoxides, or mixtures thereof. Preferred solvents are alcohols, diols, or mixtures thereof. Most preferred solvents are sulfolane and polyols including diols, such as, for example, ethylene glycol and propylene glycol, and triols, such as, for example, glycerol.

It is believed that, for most applications, the amount of water-miscible organic solvent in the composition may be in a range having start and end points selected from the following list of weight percents: 0.5, 1, 5, 7, 10, 12, 15, 20, 25, 29, 30, 33, 35, 40, 44, 50, 59.5, 65, 70, 75, and 80. Examples of such ranges of solvent include from about 0.5% to about 59.5% by weight; or from about 1% to about 50% by weight; or from about 1% to about 40% by weight; or from about 0.5% to about 30% by weight; or from about 1% to about 30% by weight; or from about 5% to about 30% by weight; or from about 5% to about 20% by weight; or from about 7% to about 20%, or from about 10% to about 30% by weight; or from about 20 to about 70%, or from about 15% to about 25% by weight of the composition.

Nitrogen-Containing Compound (Silicon Oxide Corrosion Inhibitor)

The etching compositions of the present invention comprise at least one nitrogen-containing compound selected from (or selected from the group consisting of) a $C_{4-12}$ alkylamine, a polyalkylenimine, a polyamine, a nitrogen-containing heterocyclic compound, a nitrogen-containing aromatic compound, a nitrogen-containing heterocyclic and aromatic compound. The nitrogen-containing heterocyclic and aromatic compound may comprise an aromatic heterocyclic ring or at least one heterocyclic ring and at least one aromatic ring.

Examples of suitable $C_{4-12}$ alkylamines include hexylamine, surfactant salts of hexylamine, octylamine, surfactant salts of octylamine, decylamine, surfactant salts of decylamine, dodecylamine, and surfactant salts of dodecylamine.

Preferably, the polyalkyleneimine is a polyethyleneimine (PEI). Any PEI may be used, but it is preferred that a homopolymeric polyethyleneimine is employed. The PEI may be branched or linear, but preferably it is branched.

While it has been found that the PEI used may have any formula weight for effectiveness, preferably the PEI has a lower molecular weight. In an embodiment, the PEI has a molecular weight between 100 and 50,000, between 400 and 25,000, between 800 and 10,000, or between 1000 and 3000.

In an embodiment, the polyalkyleneimine comprises a polyethyleneimine (PEI) and preferably the PEI comprises less than 5% by weight of the composition, preferably less than 1.5% by weight, preferably less than 0.5%, or less than 0.25% by weight of the composition and most preferably less than 0.02% by weight of the composition. Preferably the PEI has a molecular weight between 100 and 2500, preferably 200 and 1500 and most preferably between 400 and 1200.

In a preferred embodiment, the polyalkyleneimine has a weight average molecular weight between 100 and 2500, between 200 and 1500, between 400 and 1200, or between 700 and 900. A molecular weight of 800 is particularly suitable. The molecular weight is suitably determined by light scattering techniques known in the art.

Polyethyleneimines are commercially available, for example Lupasol® 800 which is supplied by BASF.

Examples of polyamines include pentamethyldiethylenetriamine (PMDETA), triethylenediamine (TEDA), triethylenetetramine (TETA), tetramethylethylenediamine (TMEDA), and diethylenetriamine (DETA).

Examples of nitrogen-containing heterocyclic compounds include anilines and/or derivatives of aniline, triazoles and/or derivatives of triazoles; thiazole and/or derivatives of thiazole; tetrazole and/or derivatives of tetrazole; and thiadiazole and/or derivatives of thiadiazole.

Examples of a nitrogen-containing aromatic compounds include aminobenzolate and/or derivatives of aminobenzolate; and phenylenediamine and/or derivatives of phenylenediamine.

Examples of a nitrogen-containing heterocyclic and aromatic compound include quinoline and/or derivatives of quinoline; pyridine and/or derivatives of pyridines benzimidazole and/or derivatives of benzimidazole and/or derivatives of benzimidizole; imidazole and/or derivatives of imidazole; and triazines and/or derivatives of triazine; and piperazines and/or derivatives of piperazines.

Examples of aniline and/or derivatives of aniline, include aniline, 3,4-(methylenedioxy)aniline, aniline-2-sulfonic acid, N-(2-hydroxyethyl)aniline, 4-(trifluoromethyl)aniline, 4-(methylthio)aniline, 3-(methylthio)aniline, 3-(1-aminoethyl)aniline, 4-(octyloxy)aniline, 4-(piperidin-1-ylmethyl) aniline, p-toluidine, n-ethyl 4-fluoroaniline, 4-isopropylaniline, 4-nitroaniline, p-anisidine, 4-chloroaniline and 4-iodoaniline.

Examples of aminobenzolate and/or derivatives of aminobenzolate includes methyl 4-aminobenzoate.

Examples of phenylenediamine and/or derivatives of phenylenediamine include N,N-diethyl-p-phenylenediamine, N,N-dimethyl-p-phenylenediamine, o-phenylenediamine, N-phenylethylenediamine; m-phenylenediamine, p-phenylenediamine, 4,5-dimethyl-1,2-phenylenediamine, 4-methyl-o-phenylenediamine, 4-methyl-m-phenylenediamine, 2-methyl-m-phenylenediamine, N-phenyl-o-phenylenediamine, 4-nitro-o-phenylenediamine, 3-nitro-1,2-phenylenediamine, and 4,5-dichloro-o-phenylenediamine, 2,3-diaminotoluene, 3,4-diaminotoluene, 3,4-diaminobenzophenone, 3 4-diaminebenzoic acid and 3,4-diaminoanisole.

Examples of quinoline and/or derivatives of quinoline include quinoline, quinoline-8-methanol, 7-bromo-8-hydroxyquinoline, 8-hydroxyquinoline (8-HQ), 8-hydroxyquinoline sulfate monohydrate, 8-quinolinol hemi sulfate salt, 5-chloro-8-quinolinol, 2-amino-8-quinolinol, 4,8-dimethyl-2-hydroxyquinoline, 8-hydroxy-2-methyl quinoline, 2-methyl-8-quinolinol, 8-hydroxy-5-nitroquinoline, 8-hydroxy-2-quinolinecarboxaldehyde, 8-hydroxy-2-quinolinecarboxylic acid and 2,8-quinolinediol.

Examples of pyridine and/or derivatives of pyridines include pyridine, pyridine hydrochloride, 4-(aminomethyl) pyridine, 2-(methylamino)pyridine, 2-(dimethylamino)pyridine, 4-(dimethylamino)pyridine, 2-picolinic acid, 2-aminopyridine and 2,4-diaminopyridine.

Examples of benzimidazole and/or derivatives of benzimidizoleimidazole include benzimidazole, 2-mercaptobenzimidazole (MBI), mercaptobenzimidazole and 4-methyl-2-phenylimidazole.

Examples of triazoles and/or derivatives of triazoles include thiol-triazole and derivatives thereof, benzotriazole (BTA), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 4-methyl-4H-1,2,4-triazole-3-thiol, 3-isopropyl-1,2,4-triazole, 5-phenylthiol-benzotriazole, halo-benzotriazoles (halo=F, Cl, Br or I) and naphthotriazole.

Examples of thiazole and/or derivatives of thiazole include thiazole, 2-mercaptobenzothiazole and 2-mercaptothiazoline.

Examples of tetrazole and/or derivatives of tetrazole include 5-aminotetrazole, methyltetrazole, 1,5-pentamethylenetetrazole, 1-phenyl-5-mercaptotetrazole and 5-aminotetrazole monohydrate.

Examples of thiadiazole and/or derivatives of thiadiazole include 5-amino-1,3,4-thiadiazole-2-thiol.

Examples of triazines and/or derivatives of triazines include 2,4-diamino-6-methyl-1,3,5-triazine, diaminomethyltriazine, triazine and 1,3-dimethyl-2-imidazolidinone.

Further some of the above listed nitrogen containing compounds may comprise cyclic and/or heterocyclic rings that are sulfur and amino substituted, such as, 1-phenyl-5-mercaptotetrazole, imidazoline thione, mercaptobenzimidazole, 4-methyl-4H-1,2,4-triazole-3-thiol, and 5-amino-1,3,4-thiadiazole-2-thiol; and 1H-pyrazole and 1-(2-aminoethyl) piperazine.

The at least one nitrogen containing compound functions primarily to protect the silicon oxide from corrosion or etching.

In some embodiments the compositions contain nitrogen-containing aromatic compound and/or nitrogen-containing heterocylic and aromatic compound. In some embodiments, the compositions contain phenylenediamine and/or derivatives of phenylenediamine and/or quinoline and/or derivatives of quinoline. In some embodiments, the nitrogen containing compound may be one or more selected from 8-HQ (8-hydroxyquinoline), 3,4-toluenediamine, 4-isopropylaniline, 8-hydroxy-2-methylquinoline, benzimidazole, and 1H-pyrazole.

It is believed that, for most applications, the total amount of the at least one nitrogen-containing compound selected from (or selected from the group consisting of) a $C_{4-10}$ alkylamine, a polyalkylenimine, a polyamine, a nitrogen-containing heterocyclic compound, a nitrogen-containing aromatic compound, a nitrogen-containing heterocyclic and aromatic compound in the composition may be in a range having start and end points selected from the following list of weight percents: 0.01, 0.05., 0.10, 0.15, 0.20, 0.25, 0.30, 0.35, 0.40, 0.45, 0.50, 0.55, 0.60, 0.65, 0.70, 0.75, 0.80, 0.85, 0.90, 0.95, 1.0, 1.25, 1.5, 2.5, 2.75, 3.0, 3.25, 3.5, 3.75, and 4.0. Examples of such ranges of nitrogen-containing compound include from about 0.01% to about 4.0% by weight; 0.5% to about 3% by weight or from about 0.10% to about 3.0% by weight; or from about 0.10% to about 0.25% by weight; or from about 0.1% to about 0.20%, or from about 0.1% to about 5.0% by weight of the composition.

Surfactants (Optional)

The etching compositions of the present invention optionally comprise at least one surfactant. The surfactant functions to protect the silicon oxide from etching. Surfactants for use in the compositions described herein include, but are not limited to, amphoteric salts, cationic surfactants, anionic surfactants, zwitterionic surfactants, non-ionic surfactants, and combinations thereof including, but not limited to, bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, and dodecyl phosphate.

Non-ionic surfactants contemplated include, but are not limited to, polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis(ethoxylate-block-propoxylate) tetrol (Tetronic 90R4), polyethylene glycols (e.g., PEG 400), polypropylene glycols, polyethylene or polypropylene glycol ethers, block copolymers based on ethylene oxide and propylene oxide (Newpole PE-68 (Sanyo), Pluronic L31, Pluronic 31 R1, Pluronic L61, Pluronic F-127), polyoxypropylene sucrose ether (SN008S, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched (IGEPAL CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0

(Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and ethoxylated fluorosurfactants (ZONYL® FSO-100, ZONYL® FSN-100).

Cationic surfactants contemplated include, but are not limited to, cetyl trimethylammonium bromide (CTAB), heptadecanefluorooctane sulfonic acid, tetraethylammonium, stearyl trimethylammonium chloride (Econol TMS-28, Sanyo), 4-(4-diethylaminophenylazo)-1-(4-nitrobenzyl) pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336 and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide and di(hydrogenated tallow)dimethylammonium chloride (e.g., Arquad 2HT-75, Akzo Nobel). In some embodiments, cationic surfactants, for examples, bromide-containing surfactants, such as, 1-hexadecyltrimethylammonium bromide are preferred.

Anionic surfactants contemplated include, but are not limited to, ammonium polyacrylate (e.g., DARVAN 821A), modified polyacrylic acid in water (e.g., SOKALAN CP10S), phosphate polyether ester (e.g., TRITON H-55), decylphosphonic acid, dodecylphosphonic acid (DDPA), tetradecylphosphonic acid, hexadecylphosphonic acid, octadecylphosphonic acid, dodecylbenzenesulfonic acid, poly (acrylic acid sodium salt), sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RM02, and phosphate fluorosurfactants such as Zonyl FSJ and ZONYL® UR.

Zwitterionic surfactants include, but are not limited to, acetylenic diols or modified acetylenic diols (e.g., SURFONYL® 504), cocamido propyl betaine, ethylene oxide alkylamines (AOA-8, Sanyo), N,N-dimethyldodecylamine N-oxide, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropanesulfonate. Preferably, the at least one surfactant comprises dodecylbenzene sulfonic acid, dodecyl phosphonic acid, dodecyl phosphate, TRITON X-100, SOKALAN CP10S, PEG 400, and PLURONIC F-127.

When present, the amount of surfactant may be in a range from about 0.001 wt % to about 5 wt %, or 0.001 wt % to about 1 wt %, or from about 0.01 to about 1 wt %, or about 0.1 wt % to about 1 wt %, based on the total weight of the composition. Alternatively, it is believed that for some applications, if present, the one or more surfactants will comprise from about 0.1 wt. % to about 15 wt. % of the composition; or from about 0.1 wt. % to about 10 wt. %, or from about 0.5 wt. % to about 5 wt. %, or from about 0.05 wt. % to about 2 wt. %, or about 0.5 wt. % to about 5 wt. % of the composition. In alternative embodiments the weight percent of surfactant in the composition, based on the total weight of the composition may be within any range having start and end points selected from the following: 0.001, 0.01, 0.05, 0.1, 0.5, 1, 2, 4, 5, 8, 10 and 15.

In some embodiments the compositions of this invention will be free of or substantially free of any or all of the above-listed surfactants, in other embodiments surfactant may be present in the composition.

Other Optional Ingredients

The etching composition of the present invention may also include one or more of the following additives: chelating agents, chemical modifiers, dyes, biocides, and other additives. The additive(s) may be added to the extent that they do not adversely affect the performance of the composition. These include, for example, ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N',N'-ethylenediaminetetra (methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, and cysteine. Preferred chelating agents are aminocarboxylic acids such as EDTA, CyDTA and aminophosphonic acids such as EDTMP.

In some embodiments the compositions of this invention will be free of or substantially free of any or all of the above-listed chelating agents in any combination.

Other commonly known components such as dyes, biocides etc. can be included in the cleaning composition in conventional amounts, for example, amounts up to a total of about 5 weight % of the composition.

Other embodiments may be free of or substantially free of dyes and/or biocides and/or other additives in any combination.

Examples of some embodiments of this invention will comprise from about 10% to about 50% by wt., or from about 20% to about 30% by wt., or from 20% to about 40% by wt., or from about 23% to about 27% by wt. water; from about 0.1 to 10% by weight, 1% to about 4% by wt., or 1% to about 3% by wt., or from about 1.6% to about 2.4% by wt. of at least one of a quaternary ammonium hydroxide compound (neat); from about 10 to about 70% by wt, or from about 10% to about 60% by wt., or from about 20% to about 30% by wt., or from about 45% to about 55% by wt. water-miscible solvent; optionally from about 0.05 to about 5% by wt. surfactant; optionally from about 5 to about 40%, or from about 10% to about 20% by wt., or from about 12% to about 17% of an alkanolamine; and from about 0.01% to about 5.0% by wt., or from about 0.1% to about 0.35% by wt., or from about 0.10% to about 0.20% by wt. of at least one nitrogen containing compound selected from (the group consisting of) a $C_{4-12}$ alkylamine, a polyalkylenimine, a polyamine, a nitrogen-containing heterocyclic compound, a nitrogen-containing aromatic compound, or a nitrogen-containing heterocyclic and aromatic compound.

In one embodiment, the etching solution is suitable for the selective removal of polysilicon over silicon oxide from a microelectronic device, which comprises or consists essentially of: from about 0.1 to 10% by weight or 1 to about 15% of at least one of a quaternary ammonium hydroxide compound (neat); from about 5 to about 40%, or about 5 to about 15% or of at least one alkanolamine compound; from about 10 to about 70% by wt or 45 to about 55% of a water-miscible organic solvent; and from about 0.10 to about 5% (or from about 0.10 to about 0.2%) of at least one nitrogen containing compound selected from (the group consisting of) a $C_{4-12}$alkylamine, a polyalkylenimine, a polyamine, a nitrogen-containing heterocyclic compound, a nitrogen-containing aromatic compound, or a nitrogen-containing heterocyclic and aromatic compound, and further wherein the remainder is water.

In another embodiment, the etching solution is suitable for the selective removal of polysilicon over silicon oxide from a microelectronic device, which comprises or consists essentially of: 10% of at least one of a quaternary ammonium hydroxide compound (20% aqueous solution); 10% of at least one alkanolamine compound; 50% of a water-miscible organic solvent; and from about 0.10 to about 0.2% of at least one nitrogen containing compound selected from (the group consisting of) a $C_{4-12}$alkylamine, a polyalkylenimine, a polyamine, a nitrogen-containing heterocyclic compound, a nitrogen-containing aromatic compound, a nitrogen-containing heterocyclic and aromatic compound, and wherein the remainder is water.

The etching solution composition of the present invention is typically prepared by mixing the components together in a vessel at room temperature until all solids have dissolved in the aqueous-based medium.

Method

In another aspect there is provided a method for selectively enhancing the etch rate of polysilicon relative to silicon oxide in a microelectronic device such as, for example, a composite semiconductor device comprising silicon and silicon oxide by etching the composite semiconductor device in a composition comprising, consisting essentially of, or consisting of water; at least one of a quaternary ammonium hydroxide compound; optionally at least one alkanolamine compound; a water-miscible solvent; at least one nitrogen containing compound selected from (the group consisting of) a $C_{4-12}$ alkylamine, a polyalkylenimine, and a polyamine, a nitrogen-containing heterocyclic compound, a nitrogen-containing aromatic compound, or a nitrogen-containing heterocyclic and aromatic compound; and optionally, a surfactant.

The method provided selectively enhances the etch rate of polysilicon relative to silicon oxide on a composite semiconductor device comprising polysilicon and silicon oxide, the method comprising the steps of: contacting the composite semiconductor device comprising polysilicon and silicon oxide with an aqueous composition comprising or consisting essentially of: at least one of a quaternary ammonium hydroxide compound; optionally at least one alkanolamine compound; a water-miscible solvent; at least one nitrogen containing compound selected from (the group consisting of) a $C_{4-12}$alkylamine, a polyalkylenimine, a polyamine, or a nitrogen-containing heterocyclic compound, a nitrogen-containing aromatic compound, or a nitrogen-containing heterocyclic and aromatic compound; and optionally, a surfactant; and rinsing the composite semiconductor device after the polysilicon is at least partially removed, wherein the selectivity of the etch for polysilicon over silicon oxide is greater than 1,000.

An additional drying step may also be included in the method. "At least partially removed" means removal of at least 50% of the material, preferably at least 80% removal. Most preferably, 100% removal using the compositions of the present development.

The contacting step can be carried out by any suitable means such as, for example, immersion, spray, or via a single wafer process. The temperature of the composition during the contacting step is preferably from about 25 to 100° C. and more preferably from about 40 to 75° C. The contact time may be from about 1 to 60 minutes.

Compositions of the present invention surprisingly exhibit excellent etch selectivity for polysilicon over silicon oxide when used on substrates that include polysilicon and silicon oxide such as, for example, during the manufacture of a transistor. The term "selectivity" is typically used to refer to a ratio of etch rates of two materials. Compositions according to the present invention, in some embodiments, exhibit a wet etch selectivity for polysilicon/silicon oxide >1000. In other embodiments, the etch rate selectivity of polysilicon/silicon oxide >5000. In other embodiments, the etch rate selectivity of polysilicon/silicon oxide >10,000. In yet other embodiments, the etch rate selectivity of polysilicon/silicon oxide >15,000. In still other embodiments, the etch rate selectivity of polysilicon/silicon oxide >20,000.

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and an organic solvent such as, for example, isopropyl alcohol.

After the contacting step and the optional rinsing step is an optional drying step that is carried out by any suitable means, for example, isopropyl alcohol (IPA) vapor drying, heat, or by centripetal force.

The features and advantages are more fully shown by the illustrative examples discussed below.

EXAMPLES

General Procedure for Preparing the Cleaning Compositions

All compositions which are the subject of the present Examples were prepared by mixing the components in a 250 mL beaker with a 1" Teflon-coated stir bar. Typically, the first material added to the beaker was deionized (DI) water followed by the other components in no particular order.

Processing Conditions

Etching tests were run using 100 g of the etching compositions in a 250 ml beaker with a ½" round Teflon stir bar set at 400 rpm. The etching compositions were heated to a temperature of about 50 to 60 QC on a hot plate. The test coupons were immersed in the compositions for about 10 minutes while stirring.

The segments were then rinsed for 3 minutes in a DI water bath or spray and subsequently dried using filtered nitrogen. The polysilicon and silicon oxide etch rates were estimated from changes in the thickness before and after etching and was measured by spectroscopic ellipsometry (SCI FilmTek SE2000). Typical starting layer thickness was 1000 Å for Si and 1000 Å for silicon oxide.

The temperature of the polysilicon etching solution disclosed herein, i.e., the temperature used upon etching the dummy gate, is typically from about 20 to about 80° C., preferably from about 20 to about 70° C. and more preferably from about 20 to about 60° C. The temperature of the etching solution upon use may be appropriately determined according to etching conditions or material of the substrate used.

The treating time upon the etching treatment with the silicon etching solutions disclosed herein, i.e., the time required for etching the dummy gate, is usually in the range of from about 0.1 to about 10 min, preferably from 0.2 to 8 min and more preferably from 0.3 to 5 min, and may be appropriately determined according to etching conditions or material of the substrate used. In other embodiments, the time required for etching the dummy gate, is usually in the range of from about 0.1 to about 30 min, preferably from 0.2 to 20 min and more preferably from 0.3 to 10 min.

The formulations evaluated below demonstrate that the silicon oxide etch rate could be suppressed by adding oxide inhibitors into the alkaline formulations. The etch rate selectivity of Si/silicon oxide varied based on the inhibitor added.

From the data in Tables 2 and 3, the oxide etch rate (e/r) is suppressed from 0.5 to 0.01 A/min. The selectivity of Si/silicon oxide is significantly increased.

TABLE 1

Oxide Etch Rate With Varied Additives.

|  | 515E | 515F | 515G | 515H | 515I | 515J | 515K | 515L |
|---|---|---|---|---|---|---|---|---|
| ETMAH (20%) | 10 | 10 | 10 | 10 | 10 | 10 | 10 | 10 |
| DIW | 90 | 89.9 | 89.9 | 89.9 | 89.9 | 89.9 | 89.9 | 89.9 |
| surfynol 485 |  | 0.1 |  |  |  |  |  |  |
| dynol 607 |  |  | 0.1 |  |  |  |  |  |
| SAS10 |  |  |  | 0.1 |  |  |  |  |
| CTAB |  |  |  |  | 0.1 |  |  |  |
| lupasol 800 |  |  |  |  |  | 0.1 |  |  |
| octylamine |  |  |  |  |  |  | 0.1 |  |
| Pentamethyldiethylene-triamine(PMDETA) |  |  |  |  |  |  |  | 0.1 |
| a-Si e/r @ 60 C. | 512.8 | 154.0 | 116.2 | 319.8 | 216.9 | 495.4 | 465.0 | 487.0 |
| TEOS e/r @ 60 C. | 2.4 | 0.3 | 0.2 | 0.3 | 0.2 | 0.3 | 0.3 | 0.3 |
| a-Si/TEOS selectivity | 213.7 | 513.5 | 580.9 | 1066.1 | 1084.3 | 1651.3 | 1550.0 | 1623.3 |

In Table 1, the Surfynol® 485, Dynol® 607 are non-ionic surfactants, SAS10 is Hostapur® SAS 10 anionic surfactant, CTAB is cetyltrimethylammonium bromide, a cationic surfactant, and Lupasol® 800 is a polyethylenimine, which is a nitrogen containing polymer.

From Table 1, it can be seen that the surfactants yield good oxide protection, but they also suppress polysilicon etch rate simultaneously. The nitrogen containing molecules like Lupasol® 800, octylamine and PMDETA show good oxide protection power while maintaining the polysilicon etch rate. Further formulations with these compounds were made and tested and the results are listed in Tables 2 and 3.

TABLE 2

Oxide Corrosion Inhibitors in Formulated Mixtures

|  | 506B | 506C | 506D | 506E |
|---|---|---|---|---|
| ETMAH(20%) | 10 | 10 | 10 | 10 |
| DIW | 25 | 25 | 25 | 25 |
| MEA | 15 | 15 | 15 | 15 |
| Sulfolane | 50 | 49.8 | 49.8 | 49.8 |
| lupasol 800 |  | 0.2 |  |  |
| octylamine |  |  | 0.2 |  |
| Pentamethyldiethylenetriamine (PMDETA) |  |  |  | 0.2 |
| a-Si e/r @ 60 C. | 284.1 | 273.4 | 250.1 | 263.3 |
| TEOS e/r @ 60 C. | 0.48 | 0.01 | 0.01 | 0.01 |
| a-Si/TEOS selectivity | 592 | 27340 | 25008 | 26330 |

TABLE 3

Oxide Corrosion Inhibitor in Formulated Mixtures

|  | 506A | 506F | 506G | 506H |
|---|---|---|---|---|
| ETMAH(20%) | 10 | 10 | 10 | 10 |
| DIW | 25 | 25 | 25 | 25 |
| MEA | 15 | 15 | 15 | 15 |
| DMSO | 50 | 49.8 | 49.8 | 49.8 |
| lupasol 800 |  | 0.2 |  |  |
| octylamine |  |  | 0.2 |  |
| Pentamethyldiethylenetriamine (PMDETA) |  |  |  | 0.2 |
| a Si @ 60 C. | 258.3 | 242.0 | 234.4 | 247 |
| TEOS @ 60 C. | 0.52 | 0.01 | 0.02 | 0.01 |
| a-Si/ TEOS selectivity | 497 | 24200 | 11718 | 24700 |

For the wet etching process to remove a dummy polysilicon gate, a deionized water (DIW) rinse step is typically performed after the formulated mixture processing step. When the formulated mixture is rinsed with DIW, the hydrolysis of amine produces a large amount of hydroxide ions which may further attack gate oxide and generate undesired defects.

An experiment was performed to understand the impact of the DIW rinse step on formulations 308U and 506L (with oxide corrosion inhibitor). The formulated mixtures were diluted with different proportions of DIW, then Si and oxide etch rates were examined. The compositions are shown in Table 4 and the results are shown in Tables 5 and 6.

TABLE 4

Formulated Mixtures for DIW Dilution Evaluation

|  | 308U | 506L |
|---|---|---|
| ETMAH(20%) | 12.5 | 12.5 |
| DIW | 15 | 15 |
| MEA | 47.5 | 47.5 |
| PG | 25 | 25 |
| lupasol 800 | 0 | 0.4 |

TABLE 5

DIW Dilution Effect on 308U
DIW dilution effect (308U: DIW by weight)

| 308U | 1 | 1 | 1 | 1 | 1 | 1 | 1 |
|---|---|---|---|---|---|---|---|
| DIW | 100 | 50 | 20 | 10 | 5 | 2 | 0 |
| a Si 60 C./1 min | 279.2 | 380.3 | 539.4 | 651.4 | 701.9 | 672.9 | 306.0 |
| TEOS 60 C./10 min | 0.9 | 1.0 | 1.0 | 1.1 | 0.7 | 0.5 | 0.0 |

TABLE 6

DIW dilution effect on 506 L
DIW dilution effect (506 L: DIW by weight)

| 506 L | 1 | 1 | 1 | 1 | 1 | 1 | 1 |
|---|---|---|---|---|---|---|---|
| DIW | 100 | 50 | 20 | 10 | 5 | 2 | 0 |
| a Si 60 C./1 min | 220.4 | 198.5 | 205.6 | 211.1 | 216.3 | 301.7 | 264.7 |
| TEOS 60 C./10 min | 0.1 | 0.0 | 0.1 | 0.3 | 0.4 | 0.2 | 0 |

Figure 2:
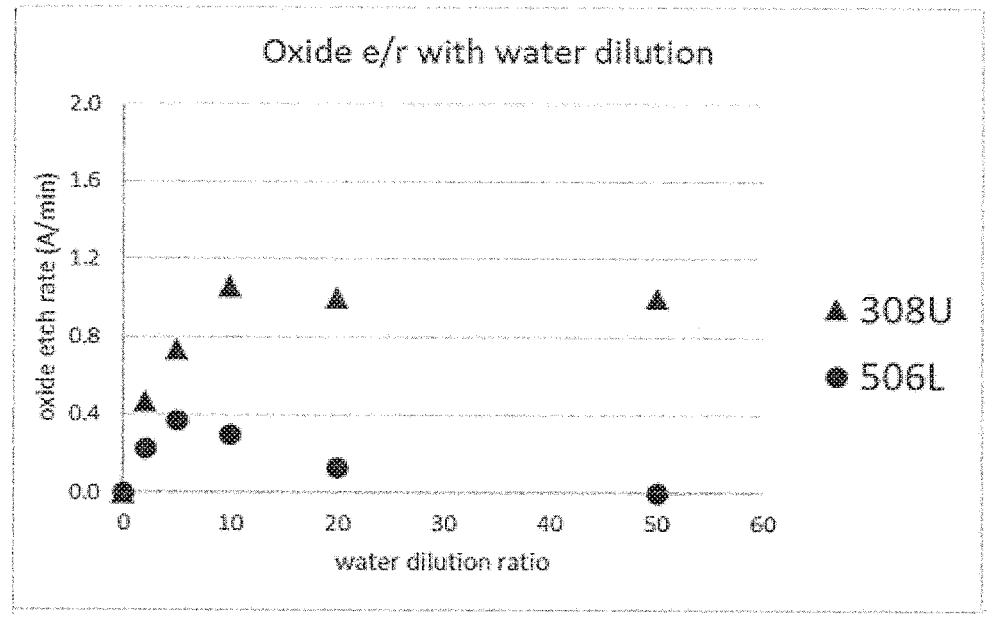
FIG. 2 is a graph illustrating the distilled water (DIW) dilution of polysilicon etchants and the effect on silicon oxide etch rates.
Figure 3:
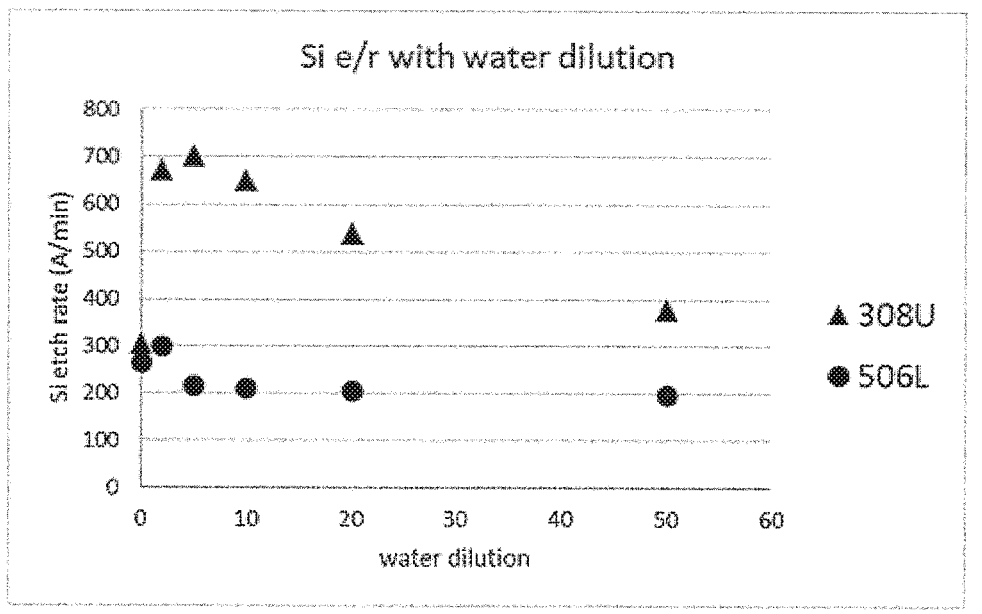
FIG. 3 is a graph illustrating the DIW dilution of polysilicon etchants and the effect on polysilicon etch rates.

FIGS. 2 and 3 illustrate that the corrosion inhibitor plays an important role in maintaining the oxide and polysilicon etch rates in mixing the formulated mixtures with DIW. The polysilicon and oxide etch rate of formulation 308U (with no silicon oxide corrosion inhibitor) went up quickly while the formulation 506L with silicon oxide corrosion inhibitor gave more stable etch rates in mixing with DIW.

To simulate the gate oxide protection, gate oxide protection ability of inhibitors can be differentiated by measuring total oxide loss for 1 hour. The compositions for this evaluation are listed in Table 7.

TABLE 7

Formulations for Evaluation of Gate Oxide Protection

| Component | 008A | 008Q | 008J | 007A | 007B | 007C | 007D | 007E | 526Z |
|---|---|---|---|---|---|---|---|---|---|
| ETMAH(20%) | 7 | 7 | 7 | 7 | 7 | 7 | 7 | 7 | 10 |
| DIW | 17.5 | 17.5 | 17.5 | 17.5 | 17.5 | 17.5 | 17.5 | 17.5 | 15 |
| MEA | 20 | 20 | 20 | 20 | 20 | 20 | 20 | 20 | 17 |
| PG | 55 | 55 | 55 | 55 | 55 | 55 | 55 | 55 | 57.5 |
| 8-Hydroxyquinoline | | 0.5 | | | | | | | |
| 3,4-Toluenediamine | | | 0.5 | | | | | | |
| 1-(2-Aminoethyl)Piperazine | | | | 0.5 | | | | | |
| 1H-Pyrazole | | | | | 0.5 | | | | |
| 4-Isopropylaniline | | | | | | 0.5 | | | |
| Benzimidozole | | | | | | | 0.5 | | |
| 8-Hydroxy-2-methylquinoline | | | | | | | | 0.5 | |
| Pentamethyldiethylenetriamine (PMDETA) | | | | | | | | | 0.5 |
| 1 hr Silicon Oxide loss(Å) | 23 | 9.9 | 10.1 | 18.5 | 17.1 | 13.3 | 19.0 | 10.1 | 15 |

An experiment was performed to understand the oxide-protection ability of the different kinds of inhibitors in Table 7, which shows that nitrogen-containing aromatic compounds give better oxide protection compared to non-inhibitor-containing formulations. Formulation 008Q which includes the 8-Hydroxyquinoline (8 HQ) provided the best protection for the oxide layer.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for the selective removal of polysilicon over silicon oxide from a microelectronic device, which comprises:
   water;
   about 1 wt % of neat tetramethyl ammonium hydroxide (TMAH);
   about 15 wt % to about 20 wt % of monoethanolamine (MEA);
   about 50 wt % to about 59.5 wt % of ethylene glycol (EG);
   about 0.5 wt % of 8-hydroxyquinoline (8-HQ); and
   optionally, a surfactant.

2. The etching solution of claim 1, wherein the at least one water-miscible organic solvent comprises about 55 wt % of ethylene glycol (EG).

3. The etching solution of claim 1 comprising:
   water;
   about 1 wt % neat of tetramethyl ammonium hydroxide (TMAH);
   about 20 wt % of monoethanolamine (MEA);
   from about 50 to about 55 wt % of ethylene glycol (EG); and
   about 0.5 wt % of 8-hydroxyquinoline (8-HQ).

4. A method for selectively enhancing the etch rate of polysilicon relative to silicon oxide in a composite semiconductor device comprising polysilicon and silicon oxide, the method comprising the steps of:

contacting the composite semiconductor device comprising polysilicon and silicon oxide with the etching solution of claim 1; and rinsing the composite semiconductor device after the polysilicon is at least partially removed, wherein the selectivity of the etch for silicon over silicon oxide is greater than 1,000.

5. The method of claim 4 further comprising the step of drying the semiconductor device.

6. The method of claim 4 wherein the selectivity of the etch for silicon over silicon oxide is greater than 15,000.

7. The method of claim 4 wherein the selectivity of the etch for silicon nitride over silicon oxide is greater than 20,000.

8. The method of claim 4 wherein the contacting step is performed at a temperature of from about 25° C. to about 100° C.

* * * * *